US011152396B2

(12) United States Patent
Lilak et al.

(10) Patent No.: US 11,152,396 B2
(45) Date of Patent: Oct. 19, 2021

(54) SEMICONDUCTOR DEVICE HAVING STACKED TRANSISTORS AND MULTIPLE THRESHOLD VOLTAGE CONTROL

(71) Applicant: Intel Corporation, Santa Clara, CA (US)

(72) Inventors: Aaron D. Lilak, Beaverton, OR (US); Rishabh Mehandru, Portland, OR (US); Gilbert Dewey, Hillsboro, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/651,030

(22) PCT Filed: Dec. 26, 2017

(86) PCT No.: PCT/US2017/068393
§ 371 (c)(1),
(2) Date: Mar. 26, 2020

(87) PCT Pub. No.: WO2020/112071
PCT Pub. Date: Jun. 4, 2020

(65) Prior Publication Data
US 2020/0251502 A1    Aug. 6, 2020

(51) Int. Cl.
*H01L 27/12* (2006.01)
*H01L 21/768* (2006.01)
(Continued)

(52) U.S. Cl.
CPC .... *H01L 27/1211* (2013.01); *H01L 21/76802* (2013.01); *H01L 21/76877* (2013.01);
(Continued)

(58) Field of Classification Search
CPC ............ H01L 21/845; H01L 21/76802; H01L 21/76877; H01L 23/5226; H01L 23/528;
(Continued)

(56) References Cited

U.S. PATENT DOCUMENTS

2006/0208253 A1* 9/2006 Kim ..................... H01L 51/0003
257/40
2006/0220134 A1* 10/2006 Huo ..................... H01L 27/1203
257/351
(Continued)

FOREIGN PATENT DOCUMENTS

KR    10-2012-0081174    7/2012

OTHER PUBLICATIONS

International Search Report and Written Opinion of the International Searching Authority, dated Jun. 18, 2020, for PCT/US2017/068393, filed Jun. 18, 2020, 11 pages.

*Primary Examiner* — Herve-Louis Y Assouman
(74) *Attorney, Agent, or Firm* — Trop, Pruner & Hu, P.C.

(57) ABSTRACT

An apparatus includes a first layer, a second layer under the first layer along an axis, and a metal layer between the first layer and the second layer along the axis. The first layer includes a first plurality of transistors, where a given transistor of the first plurality of transistors includes a gate region; and the second layer includes a second plurality of transistors. The metal layer includes a metal below the gate region, and the metal is within thirty nanometers (nm) of the gate region.

24 Claims, 11 Drawing Sheets

(51) Int. Cl.
*H01L 21/84* (2006.01)
*H01L 23/522* (2006.01)
*H01L 23/528* (2006.01)
*H01L 25/065* (2006.01)
*H01L 29/78* (2006.01)
*H01L 21/8234* (2006.01)
*H01L 29/786* (2006.01)
*H01L 27/088* (2006.01)
*H01L 21/822* (2006.01)
*H01L 27/06* (2006.01)
*H01L 29/04* (2006.01)
*H01L 29/24* (2006.01)

(52) U.S. Cl.
CPC ......... *H01L 21/845* (2013.01); *H01L 23/528* (2013.01); *H01L 23/5226* (2013.01); *H01L 25/0655* (2013.01); *H01L 29/04* (2013.01); *H01L 29/24* (2013.01); *H01L 29/785* (2013.01)

(58) Field of Classification Search
CPC . H01L 25/0655; H01L 27/1211; H01L 29/04; H01L 29/785
See application file for complete search history.

(56) References Cited

U.S. PATENT DOCUMENTS

| | | | |
|---|---|---|---|
| 2007/0041142 A1* | 2/2007 | Lal | H01H 1/0094 361/207 |
| 2009/0250757 A1* | 10/2009 | Takahashi | H01L 21/823878 257/348 |
| 2010/0194450 A1* | 8/2010 | Shimizu | G09G 3/3233 327/109 |
| 2011/0031585 A1* | 2/2011 | Xia | H01L 27/0629 257/532 |
| 2011/0215860 A1 | 9/2011 | Mazure et al. | |
| 2011/0315950 A1 | 12/2011 | Sleight et al. | |
| 2012/0003815 A1* | 1/2012 | Lee | H01L 21/76254 438/458 |
| 2013/0193550 A1* | 8/2013 | Sklenard | H01L 27/0688 257/508 |
| 2013/0200520 A1* | 8/2013 | Nguyen | H01L 24/83 257/753 |
| 2013/0283067 A1* | 10/2013 | Emma | H01L 25/0657 713/300 |
| 2016/0284866 A1 | 9/2016 | Balakrishnan et al. | |
| 2017/0207214 A1 | 7/2017 | Or-Bach et al. | |

* cited by examiner

SEMICONDUCTOR DEVICE HAVING STACKED TRANSISTORS AND MULTIPLE THRESHOLD VOLTAGE CONTROL

BACKGROUND

A metal oxide semiconductor field effect transistor (MOSFET) has an associated threshold voltage (often abbreviated as "$V_{th}$"), which defines the minimum gate-to-source voltage differential for creating a conducting path in the drain-to-source channel of the MOSFET. The threshold voltage may be manipulated in a controlled way through substrate biasing. In this manner, the substrate of a p-channel MOSFET (PMOSFET) may be electrically connected to a voltage higher than a positive supply voltage to raise the threshold voltage of the PMOSFET; and the substrate of an n-channel MOSFET (NMOSFET) may be electrically connected to a voltage lower than the negative supply voltage for purposes of increasing the threshold voltage of the NMOSFET. Raising the threshold voltage of a MOSFET may be dynamic in nature, in that, for example, the threshold may be raised during a power conservation mode for purposes of inhibiting leakage current through the MOSFET.

DETAILED DESCRIPTION

Figure 1:
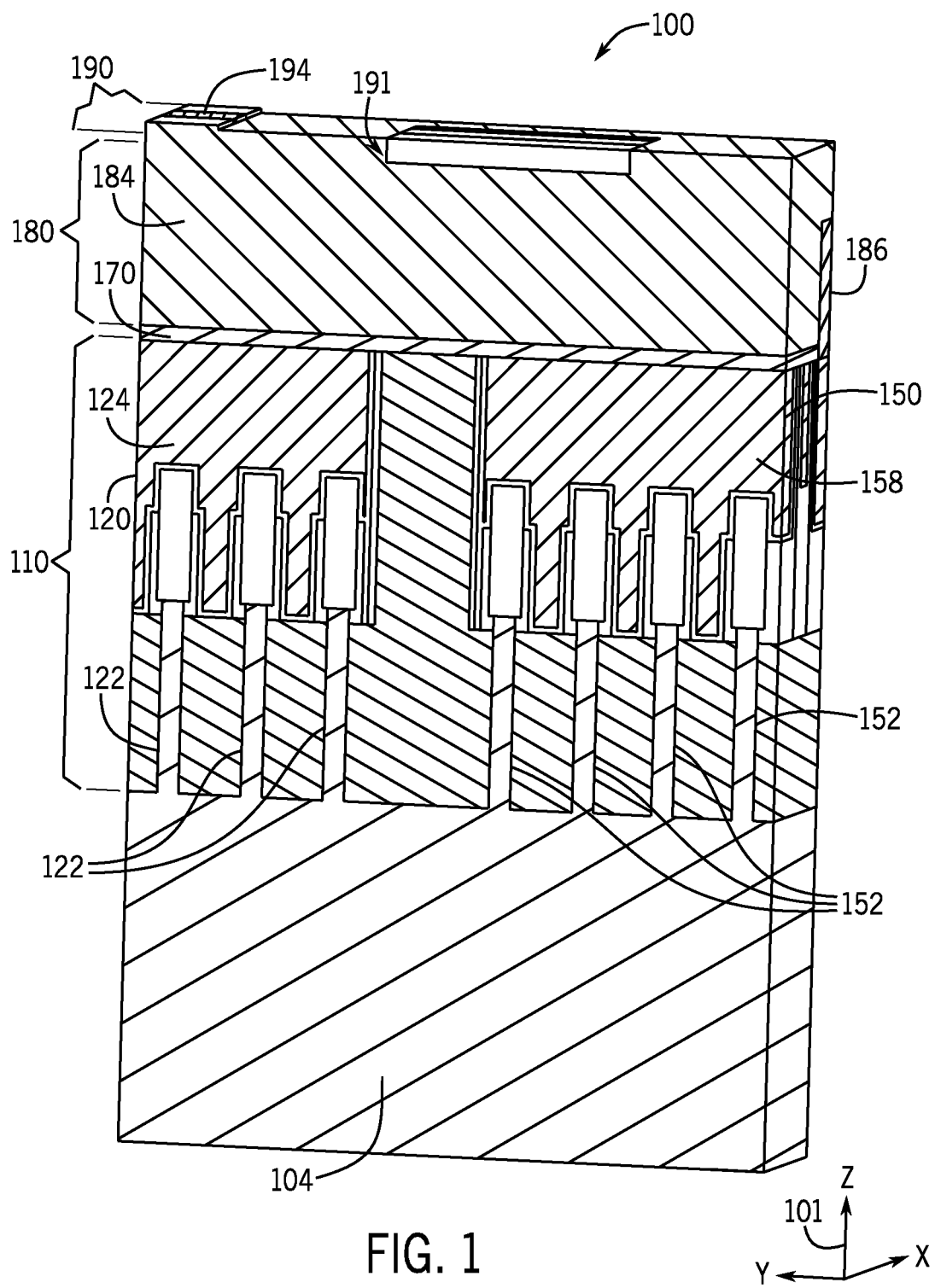
FIG. 1 is a perspective view of a semiconductor structure having vertically stacked transistor layers and an intervening metal layer having threshold control features according to an example implementation.

Reference will now be made to the drawings wherein like structures may be provided with like suffix reference designations. In order to show the structures of various implementations more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated implementations. Moreover, the drawings may only show the structures useful to understand the illustrated implementations. Additional structures known in the art may not have been included to maintain the clarity of the drawings. For example, not every layer of a semiconductor device is necessarily shown. "An implementation", "various implementations" and the like indicate implementation(s) so described may include particular features, structures, or characteristics, but not every implementation necessarily includes the particular features, structures, or characteristics. Some implementations may have some, all, or none of the features described for other implementations. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

The threshold voltage of a transistor, such as a MOSFET, may be dynamically controlled for purposes of regulating the performance of the transistor, as well as controlling leakage current. In this manner, in a threshold voltage control technique called "dynamic back bias control" (also called "dynamic substrate bias control" and "multiple threshold voltage control" herein), the substrate voltage of a transistor (an n-channel MOSFET, or NMOSFET, or a p-channel, or PMOSFET) may be controlled dynamically in a way such that the threshold voltage is lowered to place the transistor in a relatively high performance mode of operation and raised to place the transistor in a power conservation mode of operation to inhibit leakage current through the transistor's channel region.

In accordance with example implementations, a monolithic semiconductor structure (i.e., a structure in which its components are contained in a single die) implements a stacked device architecture in which layers of transistors are stacked vertically (i.e. generally stacked along the direction in which the layers of the structure are fabricated). As described herein, in accordance with example implementations, the semiconductor structure may contain a lower layer of non-planar transistors (fin-based field effect transistors (FinFETs), for example) and an upper layer of planar transistors (fully depleted-silicon on insulator (FD-SOI) transistors, for example). Moreover, the semiconductor structure may include a middle metal layer between the planar and non-planar transistor layers, and in accordance with example implementations, the middle metal layer, among its other purposes, may facilitate metal interconnections between the transistor layers.

More specifically, the middle metal layer, in general, may serve as a registration aid, to ease the burden of aligning the planar and non-planar transistor layers for purposes of forming vertical interconnections among the layers. In this manner, without the middle metal layer, it may be challenging to align interconnecting vias between the two transistor layers to form the vertical interconnections, and the middle metal layers allows for some degree of lateral misalignment.

In accordance with example implementations that are described herein, the middle metal layer serves a purpose other than facilitating interconnections among the transistor layers: the middle metal layer may contain features to form back-bias connections for the transistors of one or both transistor layers. As a more specific example, in accordance with example implementations, the upper transistor layer (above the middle metal layer) may be a layer of planar transistors, and the middle metal layer may provide back-body bias connections for the planar transistors of this layer.

Accordingly, the back-bias connections provided by the middle metal layer allows a given transistor of the upper planar transistor layer to be selectively placed in either a high performance mode of operation (e.g. a high performance "turbo mode of operation" in which the threshold voltage of the transistor is relatively small in magnitude) or a power conservation mode of operation (i.e., a mode of operation is which the threshold voltage is relatively large in magnitude for purposes of inhibiting a leakage current when the transistor is turned off), all depending upon the body bias voltage. A semiconductor structure that has features for dynamically controlling the back bias of planar transistors may be suited for various such applications, such as such as radio frequency (RF), mobile and low power applications.

Referring to FIG. 1, in accordance with example implementations, a monolithic semiconductor structure 100 is fabricated in a vertical direction (along a Z axis 101) and contains a lower, non-planar transistor layer 110 and an upper planar transistor layer 190 (i.e., the upper, planar transistor layer 190 is disposed above the lower non-planar transistor layer 110 and is fabricated after fabrication of the transistor layer 110). In this context, the "non-planar transistor layer 110" refers to a layer of non-planar, or three-dimensional (3-D), transistors. A two-dimensional (2-D), or planar, transistor, such as a transistor of the planar transistor layer 190, has a gate that overlies a planar conducting channel. A non-planar transistor has a 3-D channel.

For the specific example depicted in FIG. 1, the non-planar transistor layer 110 includes fin-based field effect transistors (FinFETs). In general, a FinFET is constructed around a relatively thin 3-D body of semiconductor material, called a "fin." FIG. 1 depicts multiple such fins 122 that are associated with multiple FinFETs.

Unlike a planar transistor, for a FinFET, the drain and source of the FinFET are fabricated in the 3-D fin 122 to form a conductive channel on/within the outer sides of the fin 122 beneath a gate dielectric. In general, the conductive channel of a FinFET may include regions in which the current extends along both the sidewalls of the fin 122, as well as along the top surface of the fin 122.

FIG. 1 depicts two FinFETs: a three fin FinFET 120 (looking into the drain/source regions of the FinFET 120 along axis X 101); and a four fin FinFET 150 (also looking into the drain/source regions of the FinFET 150 along axis X 101).

For the specific example depicted in FIG. 1, the fin 122 may be formed from or on a substrate 104 of the semiconductor structure 100. Depending on the particular implementation, the substrate 104 may be a bulk substrate, a semiconductor-on-insulator substrate or a multi-layered substrate. As specific examples, the substrate 104 may be a germanium substrate; a silicon substrate; a silicon germanium bulk substrate; a germanium; or a semiconductor-on-insulator substrate, such as a germanium, silicon, a silicon germanium on oxide substrate, a III-V substrate, such as gallium arsenide or gallium nitride, Indium Antimonide, or a III-V ternary or quaternary substrate, such as InGaAs or InGaAsP.

As depicted by the example of FIG. 1, in accordance with example implementations, the fins 122 may be extensions of the substrate 104. In this manner, dopants, such as boron, aluminum, antimony, phosphorous, or arsenic may be selectively ion-implanted into the substrate 104 to form the source and drain regions of each fin 122. The ion implantation process may then be followed by an annealing process, which activates the dopants and may also cause the dopants to diffuse further into the substrate 104.

In accordance with further example implementations, FinFETs of the non-planar transistor layer 110 may be formed from a fabrication process in which the fin is formed from an etching and replacement process in which a portion of the substrate 104 is removed to form a trench, and a semiconductor material may be deposited in the trench. In this manner, the substrate 104 may first be etched to form the trench at the location of the associated source and drain regions for a particular FinFET. An epitaxial deposition process may then be performed to fill the trench with the semiconductor material. As an example, in accordance with some implementations, the semiconductor material may be a silicon alloy, such as silicon germanium or silicon carbide. In accordance with some implementations, the silicon alloy may be doped in-situ or ex-situ with dopants, such as boron or indium for p-type regions (for a p-channel transistor), or with dopants, such as arsenic, antimony or phosphorous for n-type regions (for an n-channel transistor).

Although a FinFET is described herein as an example of a non-planar, or 3-D, transistor, the systems, apparatuses and processes that are described herein may be applied to other non-planar semiconductor structures. For example, in accordance with further implementations, a non-planar transistor layer may contain nanowire transistors. In a nanowire transistor, a nanowire is used instead of a fin, and the gate of the nanowire transistor generally surrounds the conductive channel on all sides. Accordingly, in accordance with some implementations, the nanowire transistor may have, for example, four effective gates.

The planar transistor layer 190, in general, may include multiple planar transistors, with FIG. 1 depicting an example planar transistor 191 of the layer 190. As a specific example, in accordance with some implementations, the planar transistor 191 may be a thin film transistor, such as a fully depleted-silicon on insulator (FD-SOI) transistor. In this manner, referring to FIG. 2 in conjunction with FIG. 1, the planar transistor 191 has a generally planar conducting channel that is below a gate 193 of the transistor 191 and extends laterally (along the Y axis 101) between source/drain regions 192 and 194 of the transistor 191.

Referring to FIG. 1, in accordance with example implementations, the semiconductor structure 100 includes a middle metal layer 180, i.e., a metal layer that is fabricated after the lower, non-planar transistor layer 110 and before fabrication of the upper, planar transistor layer 190. The middle metal layer 180, in accordance with example implementations, has features that allow back bias control for planar transistors of the upper planar transistor layer 190, such as, for example, planar transistor 191.

It is noted that although FIG. 1 depicts a single planar transistor layer 190, in accordance with further example implementations, the semiconductor structure 100 may include multiple planar transistor layers 190. Moreover, in accordance with further example implementations, the transistor layers 110 and 190 may be reversed (i.e., fabricated in a different order), in that, for example, the planar transistor layer 190 may be fabricated before the non-planar transistor layer 110 and as such, may be located below the non-planar transistor layer 110. In other words, in accordance with further example implementations, a semiconductor structure may include a lower planar transistor layer, a middle metal layer (having back bias features, as described herein) and an upper non-planar transistor layer.

In accordance with further example implementations, a semiconductor structure may include a lower planar transistor layer, a middle metal layer (having back bias features, as described herein) and an upper planar transistor layer. Moreover, in accordance with yet further example implementations, a semiconductor structure may include a lower transistor layer (a planar or non-planar transistor layer); a middle metal layer (having back bias features, as described herein); an upper transistor layer (a planar or non-planar transistor layer); one or multiple additional transistor layers (planar and/or non-planar transistor layers); and one or multiple metal layers providing back bias features, as described herein.

The middle metal layer 190 provides vertical interconnections between the non-planar 110 and planar 190 transistor layers. In this manner, metal contacts 124 for the non-planar transistors of the non-planar transistor layer 110 may be connected through the middle metal layer 180 to metal contacts (now shown) for terminals of the planar transistors of the planar transistor layer 190 as well to metal contacts of other devices/components of the semiconductor structure 100.

In accordance with example implementations, the middle metal layer 180 has structural features that allow back bias voltages to be applied the substrates of the planar transistors (of the planar transistor layer 190) near the conductive channels of these transistors. As described herein, these structural features may include unterminated, or cantilevered, extensions of the middle metal layer 180 in close proximity to (within 10 to 30 nanometers (nm), for example) the conductive channels of planar transistors of the planar transistor layer 190.

As depicted in FIG. 1, among its other features, the semiconductor structure 100 may include an optional etch stop layer 170 (a nitride material, for example) between the middle metal layer 180 and the non-planar transistor layer 110. Moreover, in general, the middle metal layer 180 may include a metal (such as depicted at reference numerals 186 and 194) to form vertical interconnections between the transistor layers 110 and 190 and form back bias contacts, as described herein. As examples, the metal of the metal layer 180 may be tungsten, copper, silver, nickel, aluminum, titanium, gold, gold-germanium, nickel-platinum, nickel-aluminum, cobalt or any other conductive metal or semi-metal material such as titanium nitride.

In accordance with example implementations, a dielectric material 184 may be deposited on the middle metal layer 180. As examples, the dielectric material may be silicon oxide, silicon nitride, silicon oxynitride, fluorine doped silicon dioxide, carbon doped silicon dioxide, an organic polymer, or an electrically insulative material.

Figure 2:
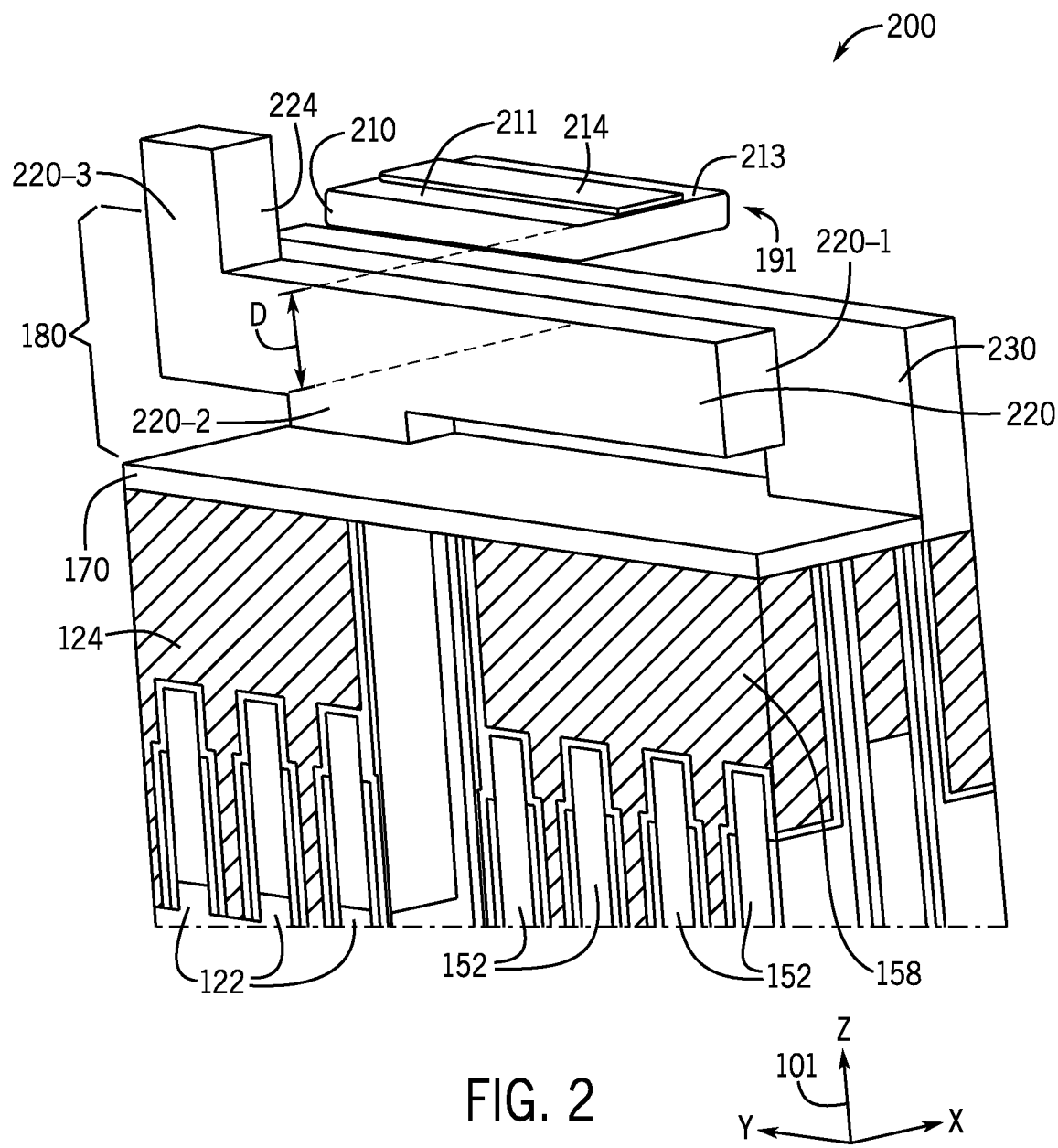
FIGS. 2 and 3 are perspective views of the semiconductor structure of FIG. 1 with a dielectric material of the middle metal layer being removed from the views according to an example implementation.

FIG. 2 is an illustration 200 of the semiconductor structure 100 of FIG. 1 absent the dielectric material 184 for purposes of illustrating example features of the middle metal layer 180 in accordance with an example implementation. Referring to FIG. 2 in conjunction with FIG. 1, the middle metal layer 180 may include one or multiple laterally extending metal traces, or segments, such as example metal segment 220, which may be used to (when the structure 100 is operational in a circuit) to 1. electrically connect component(s) of the lower, non-planar transistor layer 110 to component(s) of the upper, planar transistor layer 190 and 2. electrically communicate back bias voltages to substrates of transistors of the upper, planar transistor layer 190.

The example metal segment 220 generally laterally extends along lateral Y axis 101 and includes an extension 220-3 that extends upwardly along the vertical axis Z 101 for purpose of electrically coupling the segment 220 to a via 224. As depicted in FIG. 2, the metal segment 220 may further include another portion 220-2, which extends downwardly along the Z axis 101 for purposes of electrically coupling the segment 220 to another via (not shown). The metal segment 220 further includes a cantilevered segment 220-1, which is an unterminated part of the metal segment 220.

The cantilevered portion 220-1 of the metal segment 220 extends directly below the planar transistor 191 and in particular, extends directly below the conductive channel region of the transistor 191. In other words, in accordance with example implementations, at least part of the cantilevered portion 220-1 shares X and Y coordinates in common with the conductive channel of the planar transistor 191 but is located at a different Z coordinate. In accordance with example implementations, the cantilevered portion 220-1 is separated from the conductive channel of the planar transistor 191 by a distance, which allows a voltage of the portion 220-1 to control the threshold voltage of the transistor 191. As a more specific example, in accordance with some implementations, the upper surface of the cantilevered portion 220-1 may be separated from the gate 193 of the transistor 191 by a distance D, such that the portion 220-1 is sufficiently close to the conductive channel of the transistor to control the transistor's threshold voltage. In accordance with some implementations, the distance D may be a distance in the range of 10 to 30 nanometers (nm) (more specifically, in a range of 20 to 30 nm, in accordance with some implementations).

Figure 3:
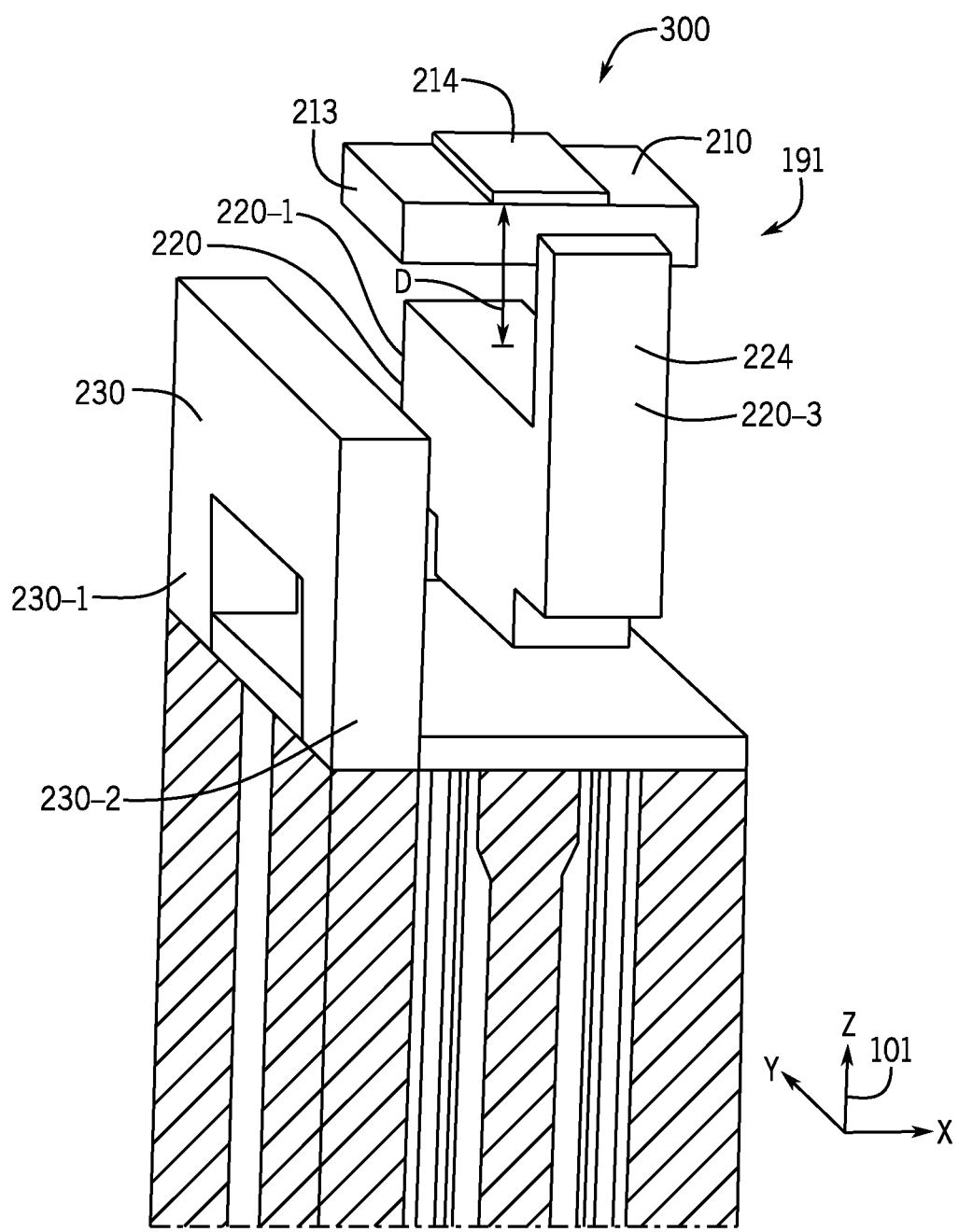

Referring to FIG. 3 in conjunction with FIG. 1, in accordance with example implementations, the middle metal layer 180 may include additional metal traces, or segments, that provide back bias control for one or multiple other transistors of the planar transistor layer 110. Moreover, the middle metal layer 180 may include one or multiple additional metal segments, or traces, which interconnect the transistor layers (or provide other interconnections for the semiconductor structure 100) but do not provide back bias control. For example, FIG. 3 depicts another example metal trace, or segment 230, which has portions that vertically extend along the vertical Z axis 101 to interconnect different nodes of the lower, non-planar transistor layer 110.

Figure 4:
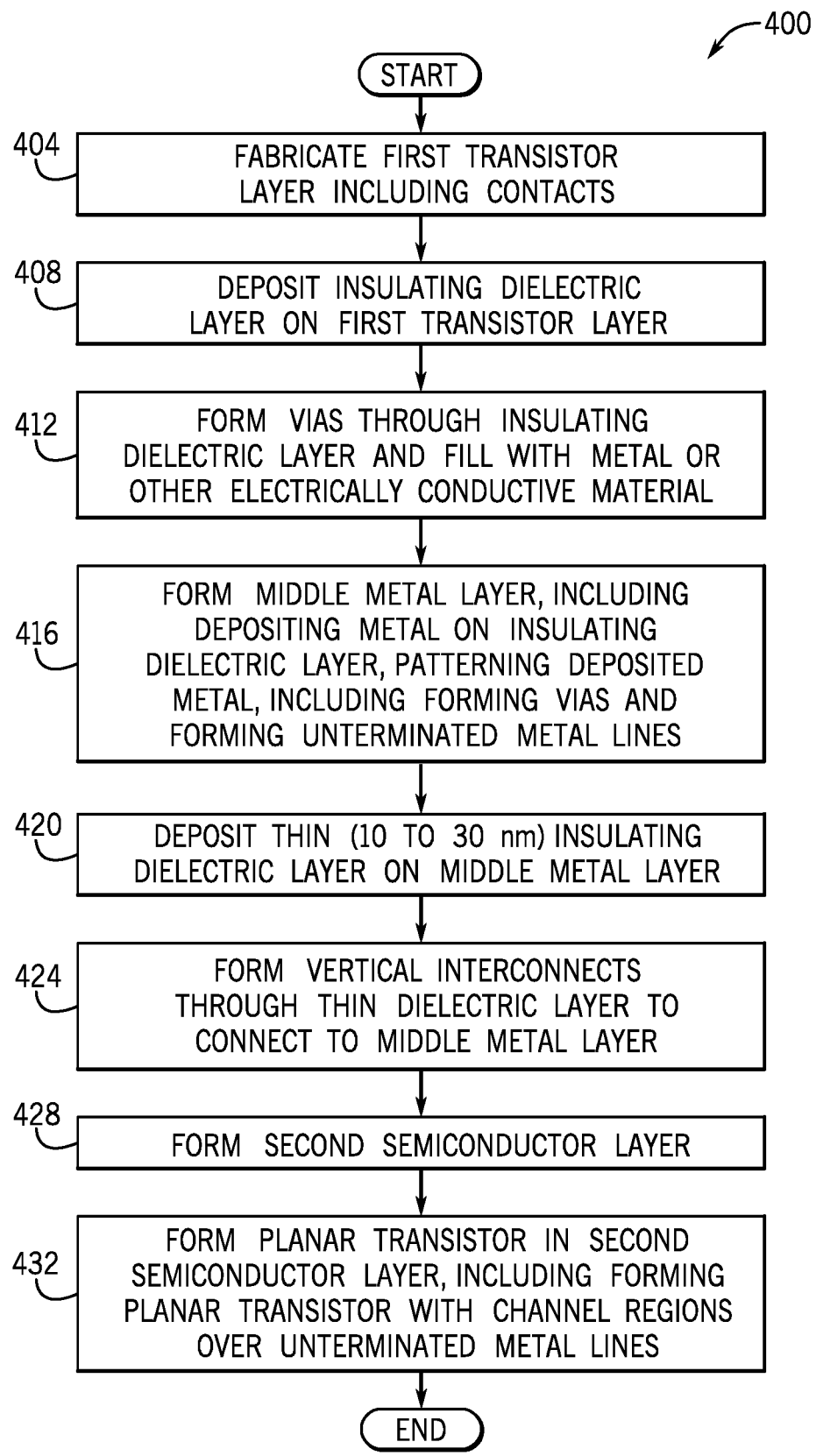
FIG. 4 is a flow diagram illustrating a process flow to fabricate a semiconductor structure having stacked transistor layers and a middle metal layer having threshold voltage control features according to an example implementation.
Figure 5A:
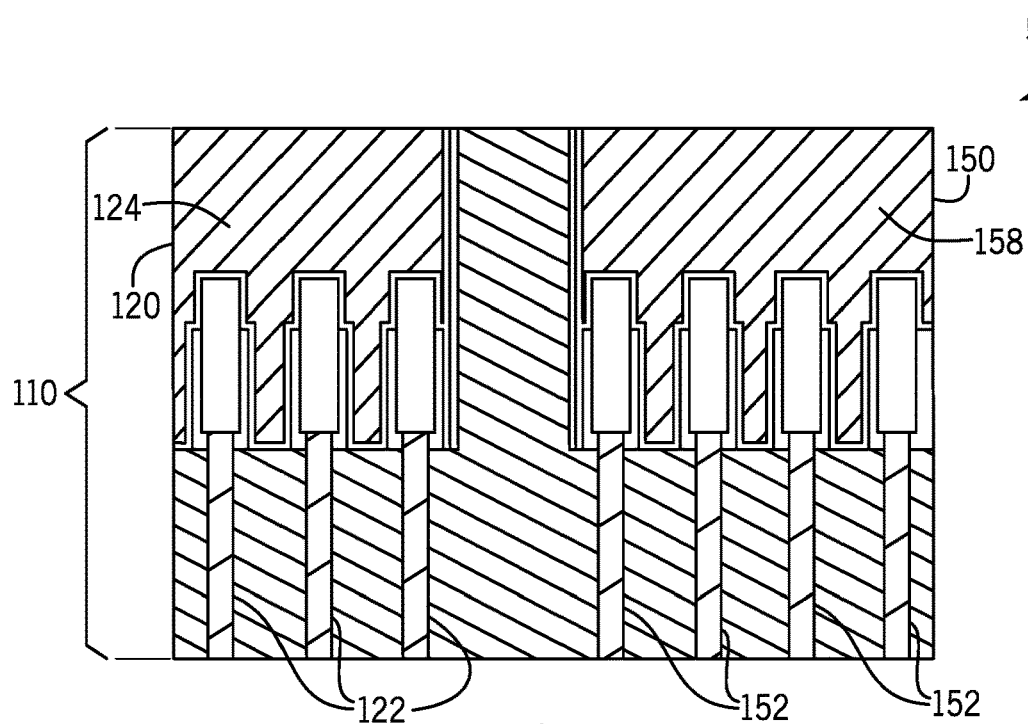
FIGS. 5A, 5B, 5C, 5D, 5E, 5F and 5G are schematic views of semiconductor structures produced by the process flow of FIG. 4 according to an example implementation.

FIG. 4 depicts an example process flow 400 for fabricating the semiconductor structure 100 in accordance with example implementations. Pursuant to the process 400, a first transistor layer may be fabricated, pursuant to block 404, in a semiconductor substrate, including metal contacts for the first transistor layer. Accordingly, a structure, such as an example structure 500 depicted in FIG. 5A, may be formed. For this specific example, the structure 500 is a non-planar transistor layer and more specifically, a FinFET layer. However, as noted above, other non-planar transistor structures may be fabricated. Moreover, the order of the non-planar and planar transistor layers may be reversed, in accordance with further example implementations.

Figure 5B:
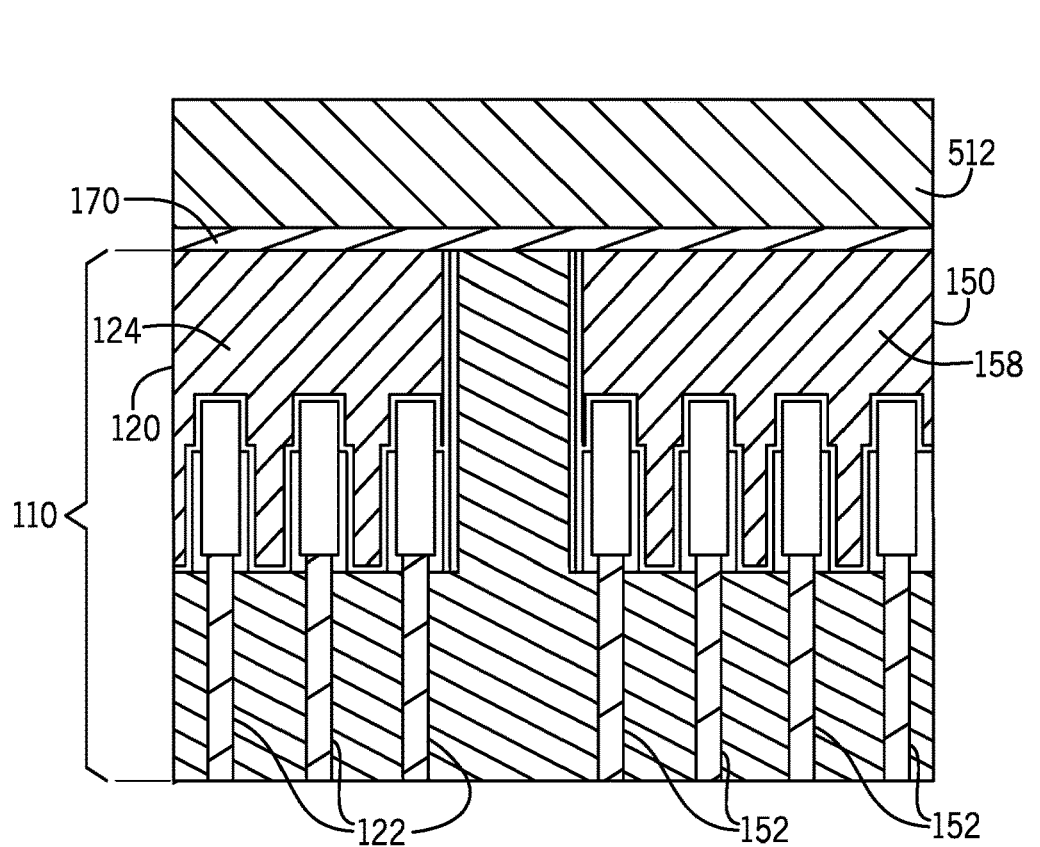

Pursuant to the process flow 400, an etch stop material 170 may be deposited on top of the first transistor layer 500 to produce an intermediate structure 510 that is illustrated in FIG. 5B. As an example, the insulating dielectric material 512 may be, for example, silicon dioxide having a thickness in the range of 10-300 nanometers (nm).

Figure 5C:
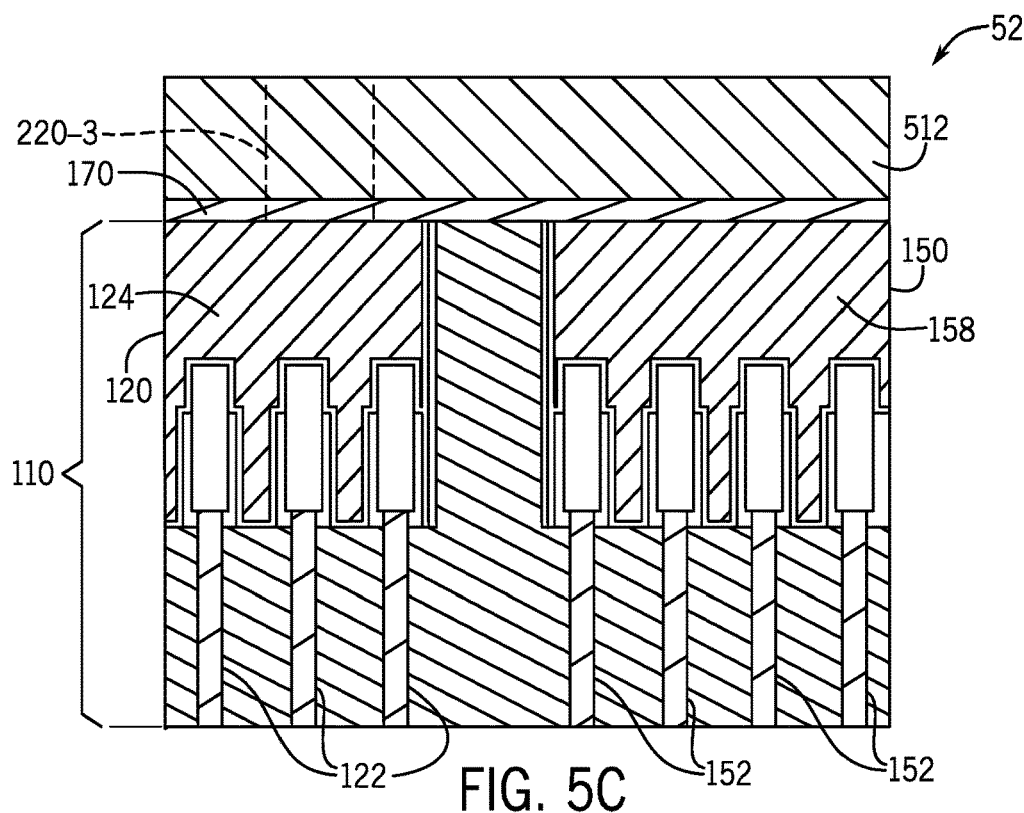

Next, pursuant to block 412, vias may be formed through the dielectric layer 512 and filled with metal work conductive media (tungsten, tin nitride, copper, and so forth). In this manner, forming the vias produces an intermediate structure 520 (FIG. 5C) in which vias, such as example via 220-3, are formed in the structure 520. These vias may contain a barrier between the metal and the insulating dielectric layer 512 for purposes of preventing diffusion of the metal within the insulating dielectric layer 512 or for other purposes.

The process flow 400 may next include depositing (block 416) a metal on the insulating dielectric layer 512, and patterning the deposited metal, including forming vias to the bottom transistor layer 110 and forming unterminated metal lines. This may be a damascene process or not, depending on the particular implementations. It is noted that connections are formed between the metal lines of vias formed in block 412. Moreover, unterminated metal lines (for purposes of forming body-bias voltage connections) are formed in block

Figure 5D:
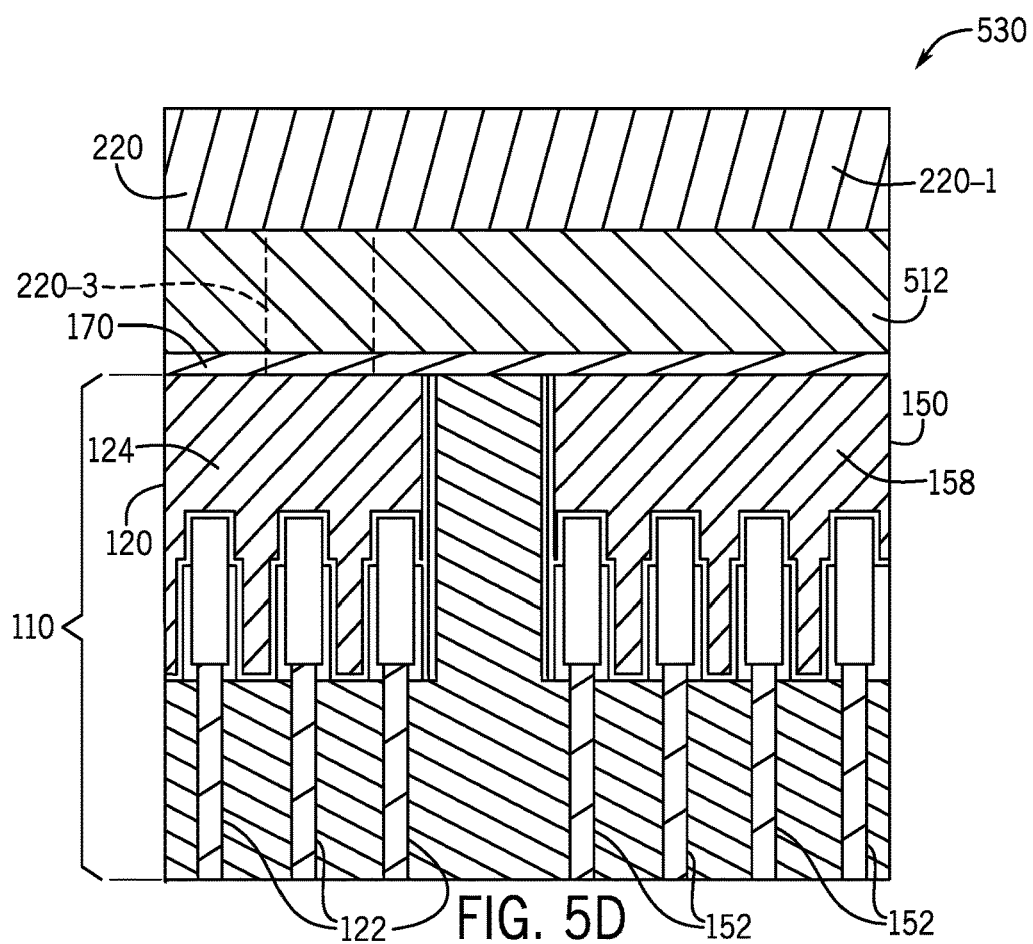

416. FIG. 5D depicts an intermediate structure 530 produced by depositing the metal 220 on the insulating dielectric layer 512 and forming the corresponding via.

Figure 5E:
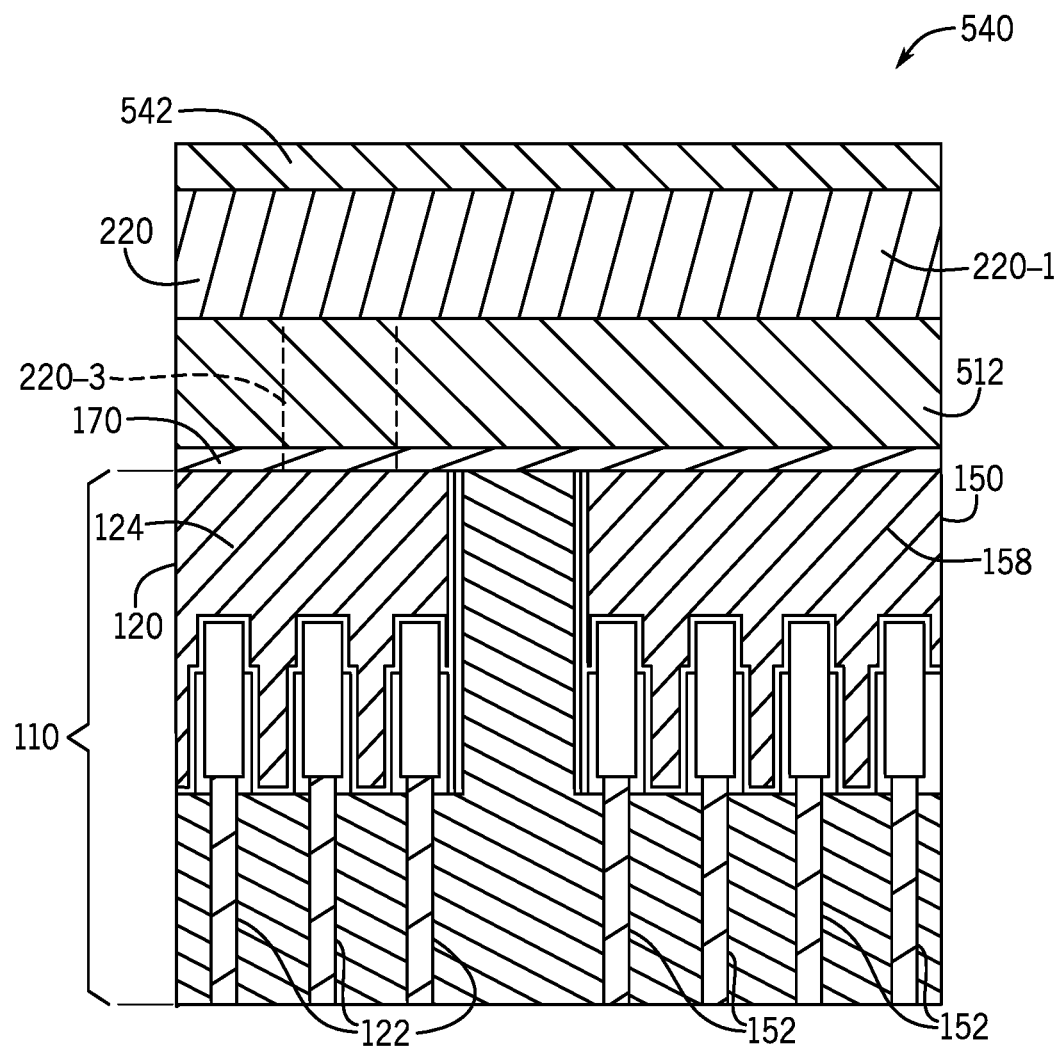

The process flow 400 may further include depositing (block 420) a relatively thin (10 to 30 nm, for example) insulating dielectric layer on the metal 220 to form an intermediate structure 540 that is depicted in FIG. 5E. It is noted that the back bias voltage is applied through the thin dielectric layer, and accordingly, the thickness of the dielectric layer sets the distance between the unterminated metal lines and the conducting channels of the planar transistors controlled by voltages applied to these unterminated metal lines.

Figure 5F:
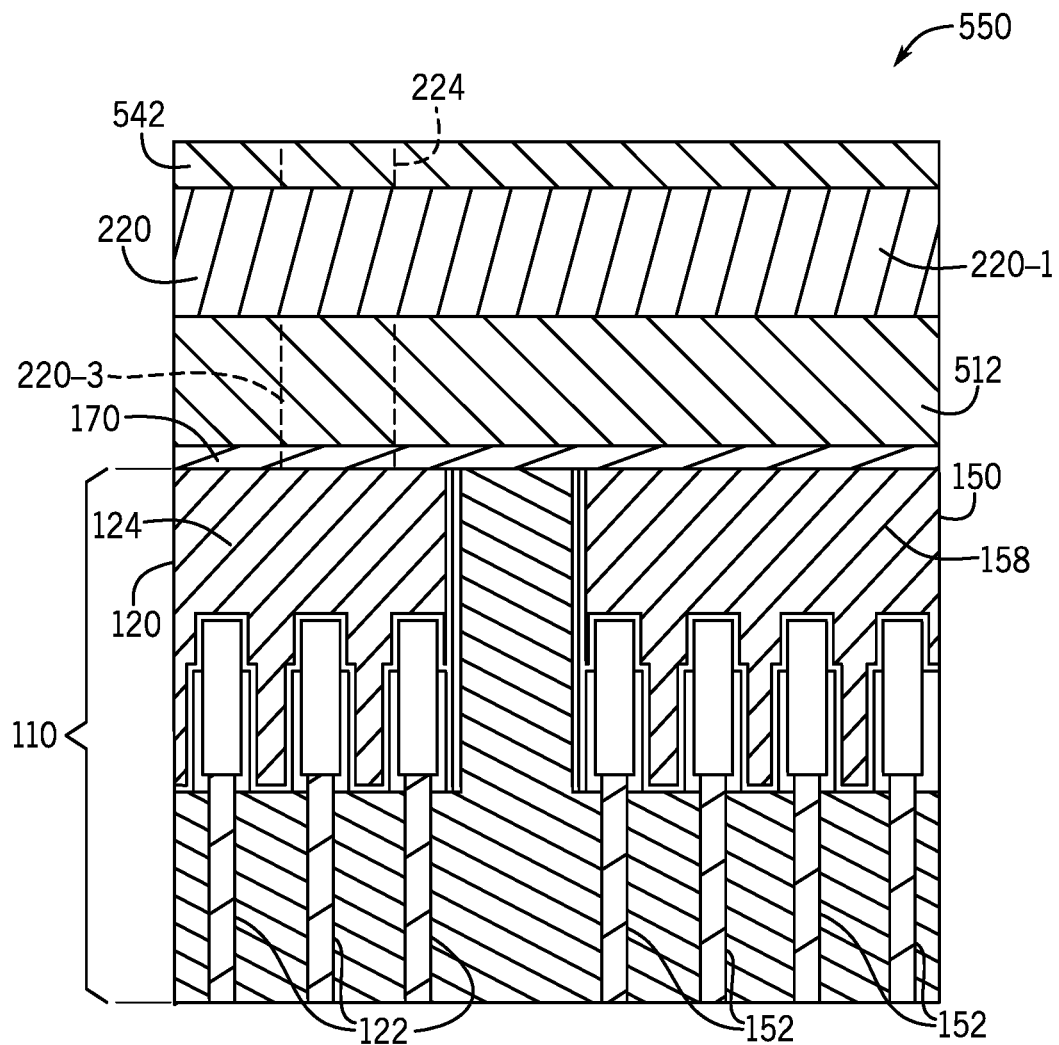

Next, pursuant to the process flow 400, vertical interconnects are formed (block 424) through the dielectric layer to connect to the middle metal layer. FIG. 5F depicts an intermediate structure 550 showing an example interconnect 224 extending through the dielectric layer.

Figure 5G:
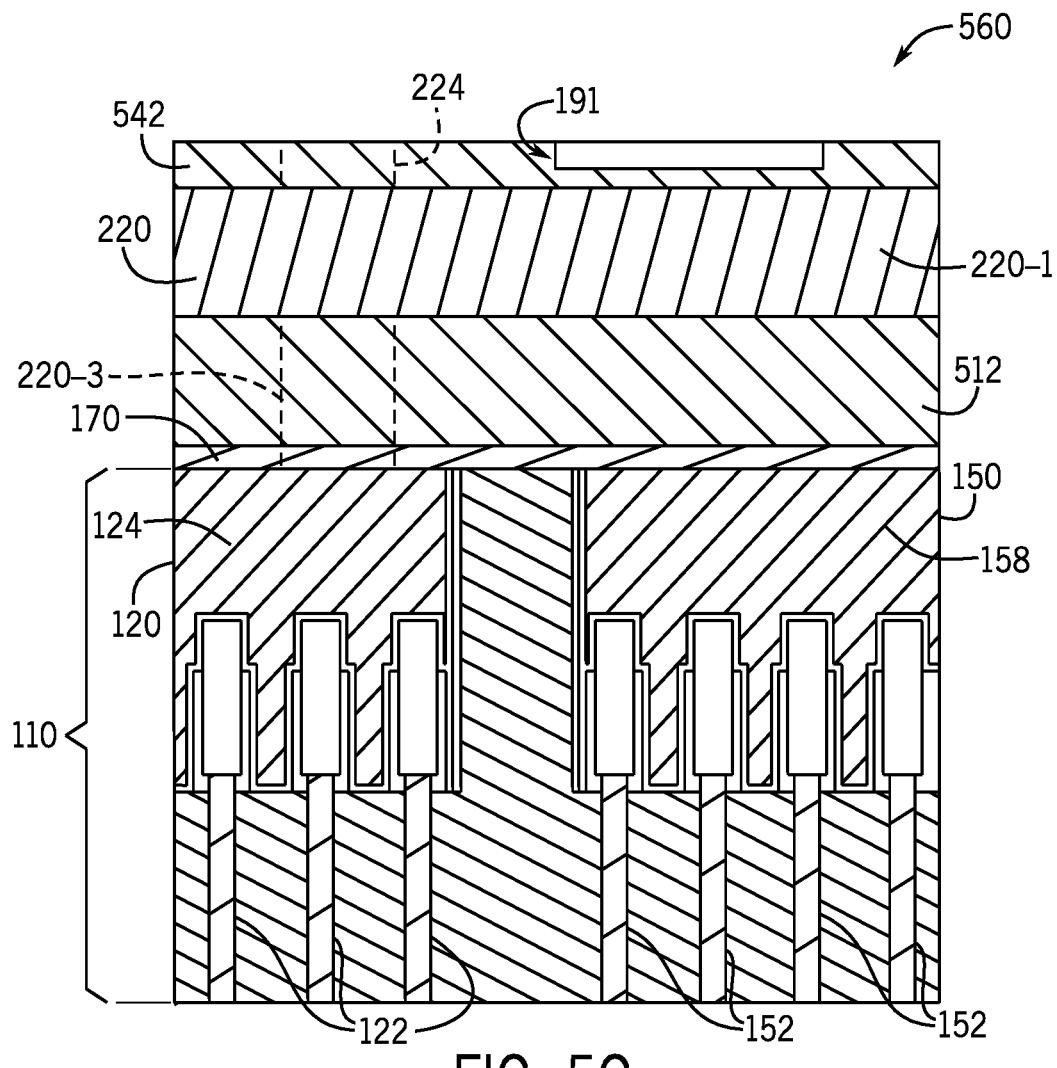

A second semiconductor layer is then formed, pursuant to block 428, to form an intermediate structure 560 that is depicted in FIG. 5G. In accordance with some implementations, the semiconductor layer may be an amorphous semiconductor material such as, for example, indium gallium zinc oxide (IGZO). However, in accordance with further example implementations, the semiconductor layer may be transferred using wafer/layer bonding. Pursuant to the technique 400, the upper, planar transistor layer may then be formed in the second semiconductor layer, pursuant to block 432, to form the planar transistors (such as planar transistor 191).

Figure 6:
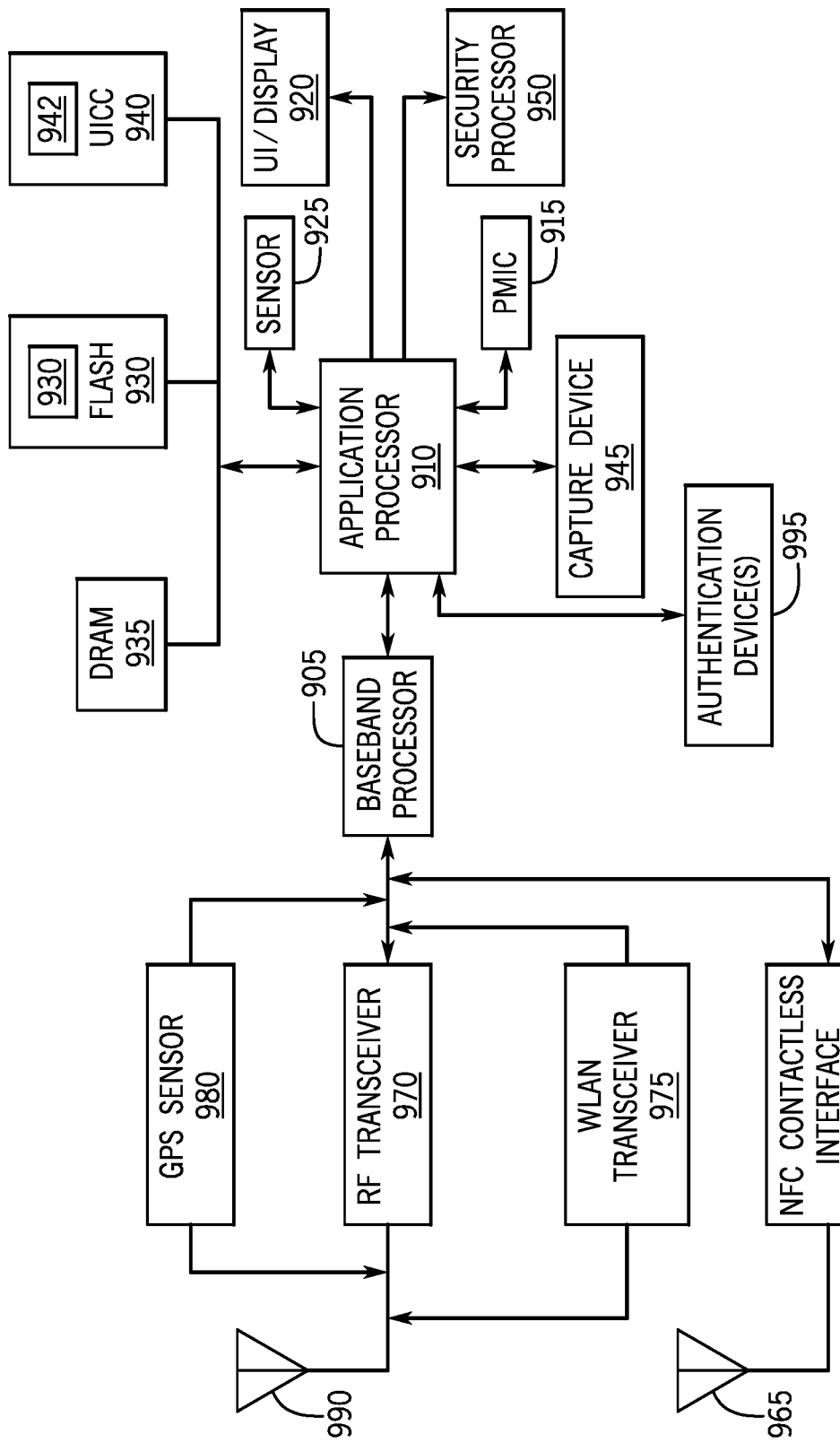
FIGS. 6 and 7 are schematic diagrams of systems according to example implementations.

Referring now to FIG. 6, in accordance with example implementations, a system may include integrated circuits, which have transistor layers that have an intervening metal layer to provide back-bias control, as described herein. For example, the system may contain various semiconductor packages, such as semiconductor packages containing a baseband processor 905, an application processor 910 and a security processor 950, where the processors of these semiconductor packages include intervening metal layer to provide back-bias control and communicate with each other.

In accordance with example implementations, the system of FIG. 6 may be, as examples, a smartphone, a wireless communicator, or any other IoT device. The baseband processor 905 may be configured to communicate with the application processor 910, and the application processor 910 may be, for example, a main CPU of the system to execute an operating system (OS) and other system software, in addition to user applications such as many well-known social media and multimedia apps. The application processor 910 may further be configured to perform a variety of other computing operations for the device.

In turn, the application processor 910 may provide output and/or receive input through a user interface/display 920 (e.g., touch screen display). In addition, the application processor 910 may store and retrieve data to/from in its embedded MIM capacitor memory, as well as possibly store/retrieve data to/from other external memories, such as a memory system that includes a non-volatile memory, namely a flash memory 930 and a volatile memory, such as a DRAM 935. In some implementations, the flash memory 930 may include a secure portion in which secrets and other sensitive information may be stored. The application processor 910 may also communicate with one or multiple input capture devices 945, such as one or multiple image capture devices that can record video and/or still images.

The system of FIG. 6 may also include a universal integrated circuit card (UICC) 940, which includes a subscriber identity module. In accordance with example implementations, the UICC 940 may include a secure storage 942 to store secure user information.

In accordance with example implementations, the security processor 950 may be a Trusted Platform Module (TPM). Moreover, the system may include one or multiple sensors 925, such as one or multiple axis accelerometers that provide input to the application processor 910 to enable input of a variety of sensed information, such as motion and other environmental information. In addition, the system may include one or multiple authentication devices 995, which may be used to receive, for example, user biometric input for use in authentication operations.

Among its other features, the system of FIG. 6 may further include a near field communication (NFC) contactless interface 960 for purposes of providing NFC communication using an NFC antenna 965. A power management integrated circuit (PMIC) 915 may communicate with the application processor 910 to perform platform level power management. To this end, the PMIC 915 may issue power management requests to the application processor 910 to enter certain low power states as desired. Furthermore, based on platform constraints, the PMIC 915 may also control the power level of other components of system.

To enable communications to be transmitted and received, such as in one or multiple Internet of Things (IoT) networks, various circuitries may be coupled between the baseband processor 905 and an antenna 990. Specifically, a radio frequency (RF) transceiver 970 and a wireless local area network (WLAN) transceiver 975 may be present. In general, the RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to the security processor 950 for use as described herein when context information is to be used in a pairing process. Other wireless communications, such as receipt or transmission of radio signals (e.g., AM/FM) and other signals may also be provided. In addition, via WLAN transceiver 975, local wireless communications, such as according to a Bluetooth™, or IEEE 802.11 standard, can also be realized.

Figure 7:
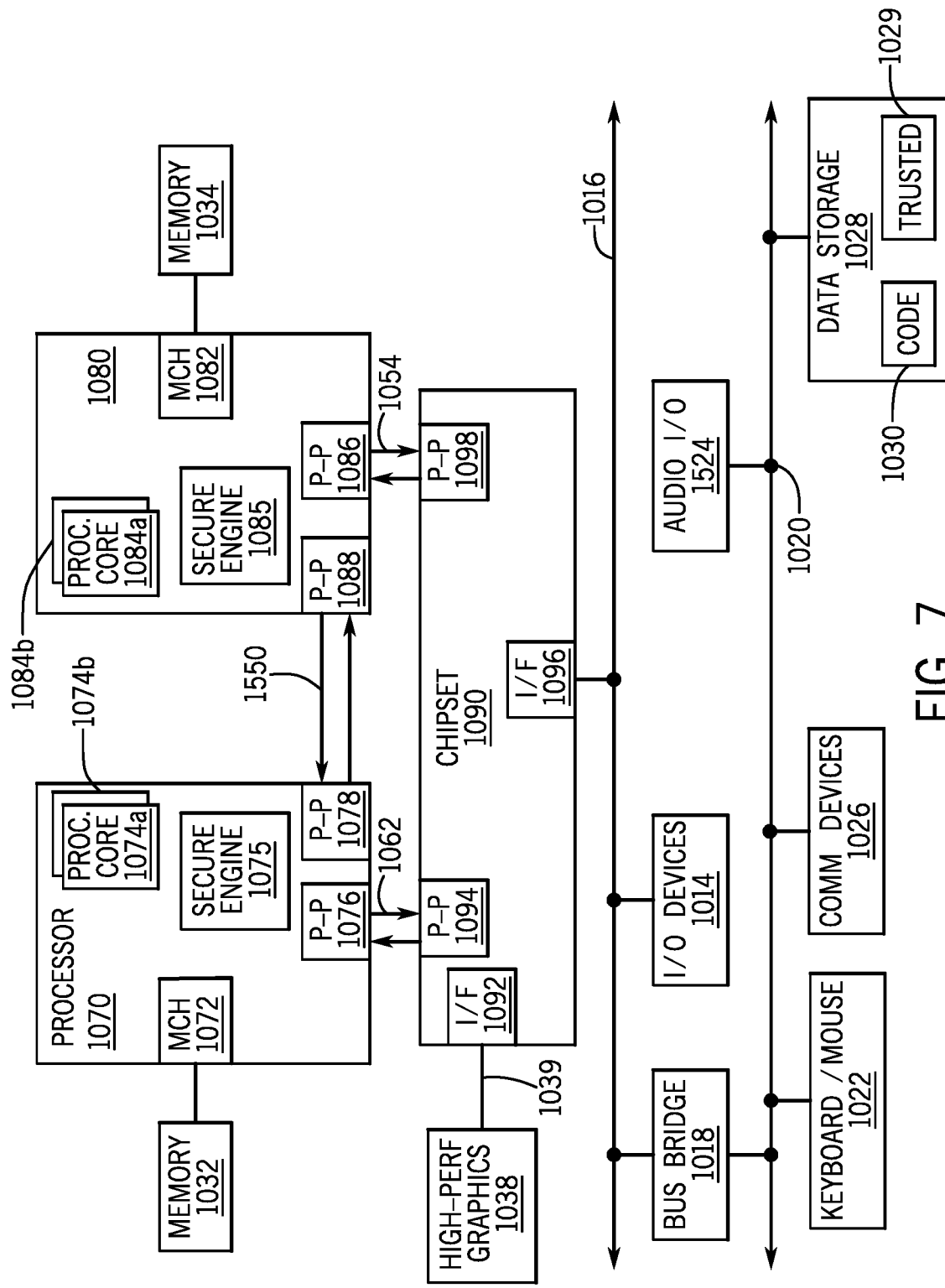

Referring to FIG. 7, in accordance with further example implementations, a multiprocessor system, such as a point-to-point interconnect system (a server system, for example) may include integrated circuits, which MIM capacitor-based memories having ground shields, as described herein. For example, the multiprocessor system may contain various semiconductor packages, such as semiconductor packages containing processors 1070 and 1080, which communicate with each other using a point-to-point interconnect 1050.

In accordance with example implementations, each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

In accordance with example implementations, one or multiple integrated circuits or semiconductor devices may include non-planar transistors having conformal metal contacts, as disclosed herein. These integrated circuits may include integrated circuits containing the processor 1010, the processor 1070, the memory 1035, the memory 1032, the memory 1032, the memory 1034 or the memory 1028, as just a few examples.

First processor 970 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1052 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one implementation. As further seen, data storage unit 1028 also includes a trusted storage 1029 to store sensitive information to be protected. Further, an audio I/O 1024 may be coupled to second bus 1020.

In accordance with example implementations, the flow process 400 of FIG. 4 may be implemented by executing machine executable instructions, or "program code," which is stored on non-transitory media. In this manner, the program code, when executed by one or multiple central processing unit(s), (one or multiple processing cores, and so forth) may cause the processor to fabricate at least one integrated circuit to perform one or multiple operations. Implementations (e.g., code for implementing the flow process 400 of FIG. 4) may be implemented in code and may be stored on a non-transitory storage medium having stored thereon instructions which can be used to program a system to perform the instructions. Implementations also may be implemented in data and may be stored on a non-transitory storage medium, which if used by at least one machine, causes the at least one machine to fabricate at least one integrated circuit to perform one or more operations. As examples, the storage media may include semiconductor storage devices, magnetic storage devices, optical storage devices, and so forth. As more specific examples, the storage media may include floppy disks, optical disks, solid state drives (SSDs), compact disk read-only memories (CD-ROMs), compact disk rewritable (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following examples pertain to further implementations.

In Example 1, an apparatus includes a first layer, a second layer under the first layer along an axis, and a metal layer between the first layer and the second layer along the axis. The first layer includes a first plurality of transistors, where a given transistor of the first plurality of transistors includes a gate region; and the second layer includes a second plurality of transistors. The metal layer includes a metal below the gate region, where the metal is within thirty nanometers (nm) of the gate region.

In Example 2, the subject matter of Example 1 can optionally include the metal being in a range of ten nm to thirty nm of the gate region.

In Example 3, the subject matter of Examples 1-2 may optionally include the metal being in the range of twenty nm to thirty nm of the gate region.

In Example 4, the subject matter of Examples 1-3 may optionally include the metal being in the range of ten nm to twenty nm from the gate region.

In Example 5, the subject matter of Examples 1-4 may optionally include a semiconductor layer between the gate region and the metal.

In Example 6, the subject matter of Examples 1-5 may optionally include a semiconductor layer between the gate region and the metal, where the semiconductor layer includes an amorphous semiconductor material.

In Example 7, the subject matter of Examples 1-5 may optionally include the semiconductor layer including indium, gallium, zinc and oxygen.

In Example 8, the subject matter of Example 5 may further include a dielectric layer between the semiconductor layer and the metal layer.

In Example 9, the subject matter of Examples 1-8 may optionally include the dielectric layer having a thickness along the axis in a range of ten nm to thirty nm.

In Example 10, the subject matter of Examples 1-9 may further include a dielectric layer to contact the gate region.

In Example 11, the subject matter of Examples 1-10 may further include the dielectric layer having a thickness along the axis of ten nm to thirty nm.

In Example 12, the subject matter of Examples 1-11 may optionally include the first plurality of transistors including planar transistors.

In Example 13, the subject matter of Examples 1-12 may optionally include the second plurality of transistors including non-planar transistors.

In Example 14, the subject matter of Examples 1-13 may optionally include the non-planar transistors including fin-based field effect transistors or nanowire transistors.

In Example 15, the subject matter of Examples 1-14 may optionally include being a first axis, and the metal including a cantilevered portion that extends along a second axis that is orthogonal to the first axis.

In Example 16, the subject matter of Examples 1-15 may further include a dielectric layer, where the cantilevered portion contacts the dielectric layer above the cantilevered portion and contacts the dielectric layer below the cantilevered portion.

In Example 17, a computing system may include a first semiconductor package and a second semiconductor package. The first semiconductor package may include a processor, where the first semiconductor package includes an apparatus according to any of Examples 1-16. The second semiconductor package may include a second processor to communicate with the first processor.

In Example 18, an apparatus includes a semiconductor package; a layer of planar transistors in the semiconductor package; a layer of non-planar transistors; and a metal layer between the layer of planar transistors and the layer of non-planar transistors. The layer of planar transistors may include a planar transistor including a gate region; and the metal layer may include a metal segment to extend within a distance of ten to thirty nm of the gate region.

In Example 19, the subject matter of Example 18 may optionally include a semiconductor material to contact the gate region and a dielectric layer to contact the semiconductor material and contact the metal segment.

In Example 20, the subject matter of Examples 18-19 may optionally include the planar transistors including fully depleted silicon on insulator transistors.

In Example 21, the subject matter of Examples 18-20 may optionally include the non-planar transistors including fin-based field effect transistors.

In Example 22, a method includes fabricating a first layer including transistors; forming a first dielectric layer on the first layer; forming a metal layer on the first dielectric layer; forming a second dielectric layer on the metal layer; and fabricating a second layer including transistors on the second dielectric layer. The fabricating may include forming a gate region of a transistor of the plurality of transistors of the second layer above a portion of the metal layer, where the gate region is within ten nm to thirty nm of the metal portion.

In Example 23, the subject matter of Example 22 may optionally include fabricating non-planar transistors.

In Example 24, the subject matter of Examples 22-23 may optionally include forming vias through the first dielectric layer; forming vias through the second dielectric layer; and patterning the metal layer to connect a first via formed in the first dielectric layer with a second via formed in the first dielectric layer.

In Example 25, the subject matter of Examples 22-24 may optionally include depositing a semiconductor layer include an amorphous semiconductor material on the second dielectric layer, where forming the second layer of transistors includes forming the second layer of transistors in the amorphous semiconductor material.

In Example 26, the subject matter of Examples 22-25 may further include transferring a semiconductor layer on the second dielectric layer using wafer bonding.

In Examiner 27, the subject matter of Examples 22-25 may further include depositing or transferring a semiconductor layer on the second dielectric layer; and forming the second layer of transistors may include forming the second layer of transistors in the semiconductor layer.

The foregoing description of the implementations of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The implementations of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

While the present disclosure has been described with respect to a limited number of implementations, those skilled in the art, having the benefit of this disclosure, will appreciate numerous modifications and variations therefrom. It is intended that the appended claims cover all such modifications and variations

What is claimed is:

1. An apparatus comprising:
   a first layer comprising a first plurality of planar transistors, wherein a given planar transistor of the first plurality of planar transistors comprises a gate region;
   a second layer under the first layer along a first axis, wherein the second layer comprises a second plurality of non-planar transistors; and
   a metal layer between the first layer and the second layer along the first axis, wherein the metal layer comprises a cantilevered portion extending along a second axis orthogonal to the first axis and having an unterminated end within thirty nanometers (nm) of the gate region along the first axis.

2. The apparatus of claim 1, wherein the unterminated end is in a range of ten nm to thirty nm of the gate region.

3. The apparatus of claim 1, wherein the unterminated end is in a range of twenty nm to thirty nm of the gate region.

4. The apparatus of claim 1, wherein the unterminated end is in a range of ten nm to twenty nm from the gate region.

5. The apparatus of claim 1, further comprising a semiconductor layer between the gate region and the unterminated end.

6. The apparatus of claim 5, wherein the semiconductor layer comprises an amorphous semiconductor material.

7. The apparatus of claim 6, wherein the amorphous semiconductor material comprises indium, gallium, zinc and oxygen.

8. The apparatus of claim 5, further comprising a dielectric layer between the semiconductor layer and the metal layer.

9. The apparatus of claim 8, wherein the dielectric layer has a thickness along the axis in a range of ten nm to 30 nm.

10. The apparatus of claim 1, further comprising a dielectric layer to contact the gate region.

11. The apparatus of claim 10, wherein the dielectric layer has a thickness along the axis of ten nm to thirty nm.

12. The apparatus of claim 1, wherein the second plurality of non-planar transistors comprise fin-based field effect transistors (FinFETs) or nanowire transistors.

13. The apparatus of claim 1, further comprising:
    a dielectric layer,
    wherein the cantilevered portion contacts the dielectric layer above the cantilevered portion and contacts the dielectric layer below the cantilevered portion.

14. The apparatus of claim 1, further comprising:
    an etch stop layer, wherein the etch stop layer is between the metal layer and the first layer, and the cantilevered portion is between the etch stop layer and the gate region.

15. The apparatus of claim 14, wherein the etch stop layer comprises a nitride.

16. A computing system comprising:
    a first semiconductor package comprising a first processor, wherein the first semiconductor package comprises an apparatus according to claim 1; and a second semiconductor package other than the first semiconductor package, wherein the second semiconductor package comprises a second processor to communicate with the first processor.

17. An apparatus comprising:
a semiconductor package;
a layer of planar transistors in the semiconductor package, wherein the layer of planar transistors comprises a planar transistor comprising a gate region;
a layer of non-planar transistors; and
a metal layer between the layer of planar transistors and the layer of non-planar transistors, wherein the metal layer comprises a cantilevered portion extending along a first axis, the cantilevered portion comprises an unterminated end, and the unterminated end is within a distance of ten to thirty nanometers of the gate region along a second axis orthogonal to the first axis.

18. The apparatus of claim 17, further comprising:
a semiconductor material to contact the gate region; and
a dielectric layer to contact the semiconductor material and contact the metal segment.

19. The apparatus of claim 17, wherein the planar transistors comprise fully depleted silicon on insulator transistors.

20. The apparatus of claim 17, wherein the non-planar transistors comprise fin-based field effect transistors (FinFETs).

21. A method comprising:
fabricating a first layer comprising non-planar transistors;
forming a first dielectric layer on the first layer;
forming a metal layer on the first dielectric layer, wherein forming the metal layer comprises forming a cantilevered portion, the cantilevered portion extends along a first axis, and the cantilevered portion comprises an unterminated end;
forming a second dielectric layer on the metal layer; and
fabricating a second layer comprising planar transistors on the second dielectric layer, wherein the fabricating comprises forming a gate region of a transistor of the plurality of transistors of the second layer above the unterminated end, wherein the gate region is within ten nanometers to thirty nanometers of the unterminated end along a second axis orthogonal to the first axis.

22. The method of claim 21, wherein fabricating the first layer of non-planar transistors comprises fabricating fin-based field effect transistors (FinFETs).

23. The method of claim 21, further comprising:
forming vias through the first dielectric layer;
forming vias through the second dielectric layer; and
patterning the metal layer to connect a first via of the vias formed in the first dielectric layer with a second via of the vias formed in the first dielectric layer.

24. The method of claim 21, further comprising:
depositing or transferring a semiconductor layer on the second dielectric layer;
wherein forming the second layer of planar transistors comprises forming the second layer of planar transistors in the semiconductor layer.

* * * * *